United States Patent [19]
Robinson et al.

[11] Patent Number: 5,385,486
[45] Date of Patent: Jan. 31, 1995

[54] WATTHOUR METER SOCKET ADAPTER WITH ADDITIONAL PLUG-IN TERMINAL CAPABILITY

[75] Inventors: Darrell Robinson, Highland Township, Oakland County; Michael E. Lewis, Ann Arbor; Karl R. Loehr, Novi; Allen V. Pruchs, Howell, all of Mich.

[73] Assignee: Ekstrom Industries, Inc., Farmington Hills, Mich.

[21] Appl. No.: 195,360

[22] Filed: Feb. 10, 1994

[51] Int. Cl.6 .................................... H01R 13/44
[52] U.S. Cl. .................................... 439/517; 439/508; 361/659
[58] Field of Search ............... 439/167, 174, 175, 508, 439/146, 517; 361/659, 665, 664, 663, 662, 661, 660, 668, 669

[56] References Cited

U.S. PATENT DOCUMENTS

| | | | |
|---|---|---|---|
| 3,035,242 | 5/1962 | Sloop | 439/508 OR |
| 3,643,209 | 2/1972 | Coston. | |
| 4,121,147 | 10/1978 | Becker et al. | 361/664 X |
| 4,404,521 | 9/1983 | Fennell | 361/664 X |
| 4,892,485 | 1/1990 | Patton. | |
| 4,977,482 | 12/1990 | Langdon et al. | |
| 5,023,747 | 6/1991 | Lindsay | 361/661 X |
| 5,134,544 | 7/1992 | Howell | 361/668 OR |

OTHER PUBLICATIONS

Ekstrom "5000" Series T60 Through In-Series Adapters Bulletin 5007, Jun., 1985.
Ekstrom 700 Series Temporary Service Adapters Brochure.

Primary Examiner—Larry I. Schwartz
Assistant Examiner—Daniel Wittels
Attorney, Agent, or Firm—Basile and Hanlon

[57] ABSTRACT

A watthour meter socket adapter includes at least one additional jaw terminal for receiving one blade terminal of a plurality of blade terminals of a watthour meter, which blade terminals are provided in a greater number than the available jaw terminals in a watthour meter socket which normally receive the line and load blade terminals of the watthour meter. The additional blade terminal extends through and outward from the watthour meter socket adapter housing. An electrical connector is mounted on the additional blade terminal externally of the watthour meter socket adapter housing for electrically receiving an electrical conductor in the socket adapter not normally connected to the line and load jaw and blade terminals in the socket adapter. A jumper is disposed within the watthour meter socket adapter housing and extends between selected additional jaw and blade terminals in the watthour meter socket adapter.

16 Claims, 5 Drawing Sheets

WATTHOUR METER SOCKET ADAPTER WITH ADDITIONAL PLUG-IN TERMINAL CAPABILITY

BACKGROUND OF THE INVENTION

1. Field of the Invention

The present invention relates, in general, to watthour meters and, more specifically, to watthour meter socket adapters mountable in a watthour meter socket and receiving a watthour meter.

2. Description of the Art

In the electric utility industry, plug-in, socket-type watthour meters are commonly used to measure electric power consumption at residential or commercial sites. A socket housing is mounted on a convenient wall surface of the residence or commercial building and contains pairs of line and load terminals which are respectively connected to electric line conductors from the electric utility power network and load conductors which extend from the socket housing to the power distribution network in the residence or commercial building. The terminals receive blade contacts of a plug-in watthour meter to complete an electric circuit through the watthour meter between the line and load terminals.

In a three phase, three wire, delta connected utility power network, the pair of line jaw terminals and the pair of load jaw terminals in the socket receive the corresponding line and load blade terminals of a watthour meter. Such a watthour meter includes current elements which measure the combined power through the pairs of line and load terminals. It is assumed that all of the power supplied through the two pair of line and load terminals and the conductors connected thereto returns through the center or third conductor of the utility network which is typically unmeasured by the watthour meter. Thus, the third or center line conductor and center load conductor are merely connected together by a connector mounted on a standoff in the socket.

However, it has been found that in some installations by merely connecting a load between ground and the third or center load conductor, unmetered power may be taken from the load distribution network. In an attempt to address this problem, Ekstrom Industries, Inc., the assignee of the present invention, previously devised a watthour meter socket adapter formed of a interconnected base and shell which had a pair of line jaw terminals and a pair of load jaw terminals mounted therein. The pairs of line and load jaw terminals extend from a jaw terminal end mounted in the shell through the base and extend outward in the form of blade terminals for removable insertion into the jaw terminals in the socket. Folded over jaw terminals were mounted in the shell at the ninth and tenth terminal positions. Lugs were connected to the folded over jaw terminals for receiving the third line conductor and the third load conductor, respectively, after such third line and load conductors were passed through apertures formed in the base and shell of the adapter.

A splice connection was required to be made to the third line and load conductors in the socket after such third line and load conductors were disconnected from the center standoff to provide a suitable length of wire to pass through the apertures in the base and shell and to extend to a connection with the lugs in the shell of the adapter. A line jaw terminal mounted in the standard 5A terminal position in the base which provided the watthour meter with a proper voltage level was disconnected in the socket from the third line jaw and then connected to the socket ground aligned with the jaw terminal in the seventh terminal position in the shell. Then, a separate jumper was passed through the shell and connected between the jaw terminal at the standard seventh terminal position in the shell and the blade terminal at the 5A terminal position in the base and socket.

These connections were necessary in order to mount a watthour meter in the socket adapter which includes an additional current element and a pair of blade terminals connected thereto for measuring power drawn through the center or third line and load conductors. However, extensive modification was required to the socket adapter in order to form the apertures in the base and shell of the adapter for passage of the jumper and splice connections therethrough. In addition, a splice connection was required to provide a sufficient length of conductor to connect the center line and load conductors in the socket to the lugs disposed within the shell of the socket adapter.

The need for the above-described adapter is an example of a frequently encountered problem in the power metering industry which occurs whenever a watthour meter which is to be plugged into a watthour meter socket contains more blade terminals than the number of jaw terminals present in the socket. Watthour meters can have additional blade terminals for a number of different applications such as for use in remote pulse initiation, remote meter reading, ground connections, etc. When it becomes necessary to use such a watthour meter in an existing socket, extensive modifications to the socket are necessary to add jaw terminals to receive the additional blade terminals on the watthour meter. Besides the inconvenience of the interruption of power to the customer while such modifications are being made to the socket, such modifications can be so extensive that a new socket is required.

Thus, it would be desirable to provide a watthour meter socket adapter which allows a watthour meter which has blade terminals not available in a socket to be used without extensive modification to the socket or the need for a new socket. It would also be desirable to provide such a watthour meter socket adapter which may be simply constructed without extensive modifications to conventional socket adapter construction. It would be desirable to provide a watthour meter socket adapter for converting three phase three wire electric utility service to three phase four wire service to a load distribution network which enables a watthour meter to measure power on all three line conductors. It would also be desirable to provide such a watthour meter socket adapter which provides a simplified connection to existing watthour meter socket third line and load conductors.

SUMMARY OF THE INVENTION

The present invention is a watthour meter socket adapter which has special connectors to allow a watthour meter having more plug-in blade terminals than the original watthour meter socket was designed to receive, to be used with the original socket. In an exemplary embodiment, the present watthour meter socket adapter is designed to convert three phase three wire electric utility service to three phase four wire service to a load distribution network wherein all three phases of electric power are measured by a watthour meter mounted in the socket adapter.

The present watthour meter socket adapter includes three pairs of line and load jaw terminals which removably receive blade terminals on a watthour meter containing three current elements for measuring power on all three line conductors. Blade terminals are integrally formed with each of the line and load jaw terminals in the watthour meter socket adapter and extend through and outward from the base of the watthour meter socket adapter. A ground blade terminal is also mounted in the socket adapter at the standard fifth terminal position for removable insertion into a grounded jaw terminal in the socket. An additional ground jaw terminal positionally offset from the ground blade terminal is mounted in the shell of the watthour meter socket adapter for receiving the ground blade terminal of a watthour meter. A jumper disposed entirely within the watthour meter socket adapter is connected between the ground jaw terminal in the shell and the ground blade terminal mounted in the base to connect the ground terminal of a watthour meter inserted into the socket adapter to socket ground.

Connector means are mounted on the pair of blade terminals at the ninth and tenth standard blade terminal positions on the socket adapter base for electrically receiving the third line and third load conductors in the socket after the third line and third load conductors have been disconnected from the center connector standoff in the socket.

The connector means preferably comprises a lug having a conductor receiving bore formed therein and a fastener receiving bore transverse to the conductor receiving bore which receives a fastener for fixedly and releasibly attaching one of the third line and load conductors to the lug. Means are also provided for mounting the lug to a blade terminal extending through and outward from the base of the socket adapter. The mounting means preferably comprises a polygonal shaped aperture formed in the blade terminal. A raised polygonal shaped boss is formed on the exterior of the lug for fixedly and non-rotationally engaging the aperture in the blade terminal. A fastener passes through the aperture in the blade terminal and the boss in the lug to fixedly attach the lug to the blade terminal.

In a preferred embodiment, the terminals in the socket adapter connected to two pairs of the line and load jaw terminals in the socket are located at the first, second, third and fourth standard terminal positions. The ground blade terminal in the socket adapter which is insertable into the ground jaw terminal in the socket connected to the third conductor in the socket is located at the fifth standard terminal position. The jaw terminal in the watthour meter socket adapter housing receiving the ground blade terminal of a three current element watthour meter is located at the seventh standard terminal position. Finally, the pair of blade terminals in the socket adapter connected to the third line and third load conductors are located at the ninth and tenth standard terminal positions. The jumper extends from the ground jaw terminal at the seventh standard terminal position to the ground blade terminal at the fifth standard terminal position.

The watthour meter socket adapter of the present invention preferably comprises a joined base and shell. The shell has an annular side wall extending between an open end and a closed, bottom or end wall. The base has a raised peripheral rim which engages the shell and forms a cavity between the base and the bottom of the shell. Pairs of aligned apertures are formed in the base and the bottom of the shell for fixedly receiving one of a plurality of electric terminals therein, the terminals having a blade terminal formed at one end extending through and outward from the base for releasible insertion into a jaw terminal in the socket and a jaw terminal at the other end disposed within the shell of the socket adapter for releasibly receiving one of the blade terminals of a watthour meter therein.

The ground jaw terminal in the watthour meter socket adapter which releasibly receives the ground blade terminal of a watthour meter is in the form of a folded over jaw terminal which is mounted in the shell and which does not include a blade terminal extending therefrom. The ground blade terminal in the watthour meter socket adapter insertable into the ground jaw terminal in the socket is mounted in the base of the socket adapter and has one end disposed in the cavity between the base and bottom of the shell of the socket adapter. The ground blade terminal in the socket adapter is positionally offset from the ground jaw terminal in the shell. The jumper connected between the ground jaw terminal and the ground blade terminal in the socket adapter extends through one of the standard terminal mounting apertures in the shell.

Also disclosed is a method of converting three phase three conductor electrical power service from a electric utility power distribution service to three phase four conductor service to an electric load distribution network at a residence or commercial site. The method comprises the steps of:

providing a watthour meter socket with a plurality of pairs of line and load jaw terminals individually connected to two of the three line conductors and two of the three load conductors passing through the watthour meter socket, and a ground jaw terminal connected to ground in the socket;

normally connecting the third line conductor to the third load conductor in the watthour meter socket;

providing a watthour meter with at least two current elements for measuring electric power through the line and load jaws in the watthour meter socket, the watthour meter having blade terminals normally connectable to two of the three pairs of line and load jaw terminals in the watthour meter socket, an additional pair of blade terminals connected to an additional current element in the watthour meter for measuring electric power on the third line and third load conductors in the watthour meter socket, and a ground blade terminal normally connectable to ground in the socket;

providing a watthour meter socket adapter having pairs of blade terminals insertable into the line and load jaw terminals in the watthour meter socket, a ground jaw terminal for receiving the ground blade terminal of a watthour meter, a ground blade terminal for insertion into a ground jaw terminal in the watthour meter socket and a plurality of pairs of jaw terminals connected to the pairs of blade terminals for receiving the blade terminals of a watthour meter;

mounting electric connectors on two blade terminals of the watthour meter socket adapter which correspond to the jaw terminals receiving the third line and the third load blade terminals of a watthour meter;

disconnecting the third line and the third load conductors from each other in the socket and a jaw at the standard fifth terminal position;

connecting the ground jaw terminal in the watthour meter socket exclusively to a ground in the watthour meter socket;

connecting the third line and third load conductors in the watthour meter socket to the electric connectors on the two blade terminals of the watthour meter socket adapter;

connecting a jumper from the ground jaw terminal in the watthour meter socket adapter to the ground blade terminal in the watthour meter socket adapter insertable into the ground jaw terminal in the watthour meter socket; and inserting the watthour meter socket adapter into the watthour meter socket and inserting a watthour meter into the watthour meter socket adapter to measure electric power on all three phases of electric power service to the electric load distribution network.

The watthour meter socket adapter of the present invention enables a watthour meter having more blade terminals than jaw terminals present in a watthour meter socket to be mounted in the socket with all of the watthour meter blade terminals properly connected for their intended purpose. The present invention utilizes a standard socket adapter which does not require extensive modifications. All wiring connections are integral with and contained within or on the watthour meter socket adapter thereby eliminating the need to form special openings in the socket adapter shell and/or base to pass external wires into the socket adapter from the socket. The watthour meter socket adapter of the present invention is easy to install without extensive external wiring to the socket so as to provide a easy apparatus and method for measuring electric power on all three legs of a three phase four wire electric power service.

BRIEF DESCRIPTION OF THE DRAWING

The various features, advantages and other uses of the present invention will become more apparent by referring to the following detailed description and drawing in which.

DESCRIPTION OF THE PREFERRED EMBODIMENT

Figure 1:
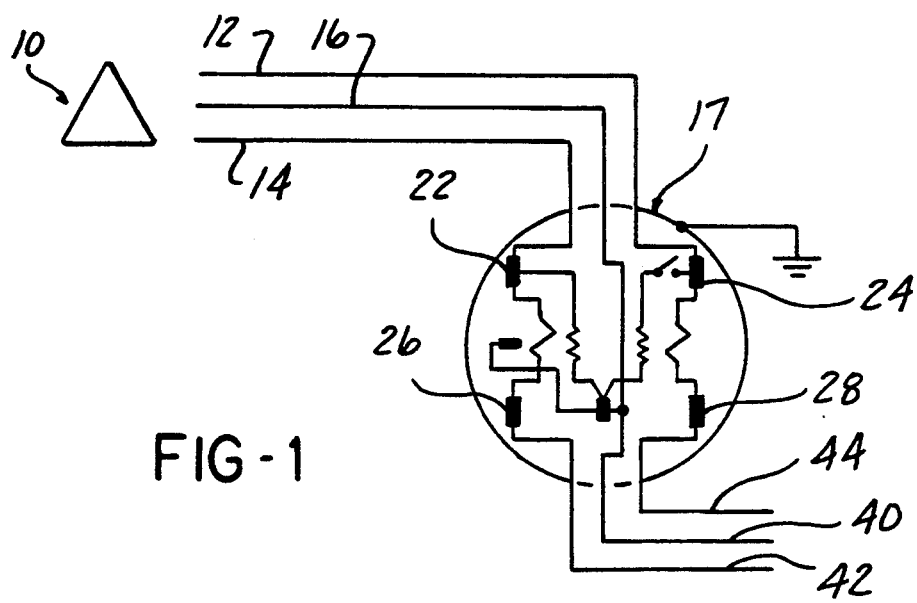
FIG. 1 is a schematic diagram of a standard three phase, three wire watthour meter.
Figure 2:
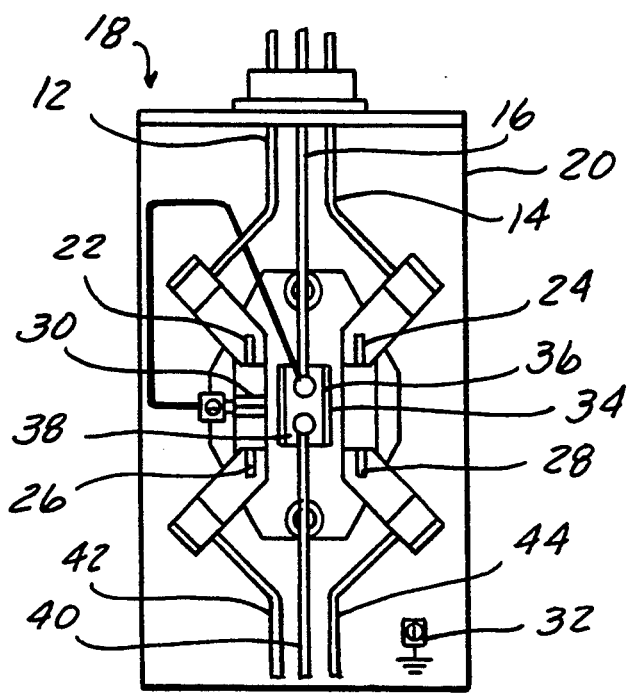
FIG. 2 is a front elevational view of a watthour meter socket for receiving the three phase three wire watthour meter shown in FIG. 1.

In order to better understand and appreciate the advantages of the present invention, a description of the conventional construction of an electric watthour meter socket and electric power distribution service will be initially presented with reference to FIGS. 1 and 2. A three phase, 240 volt delta connected electric power source 10 supplies three phase electric power service over three line conductors 12, 14 and 16 to a residential or commercial use site. The three line conductors 12, 14 and 16 are connected to a conventional electric watthour meter 17 mounted on a suitable wall surface at the residence or commercial site.

The watthour meter socket 18 includes a housing 20 which has a plurality of jaw terminals mounted therein for releasibly receiving the watthour meter 17 in a conventional mounting arrangement. The terminals in the socket housing 20 include a first pair of line jaw terminals 22 and 24 which are located respectively at the first and third standard terminal positions, and a second pair of load jaw terminals 26 and 28 which are respectively mounted at the second and fourth standard terminal positions. A potential jaw terminal 30 is also mounted in the socket housing 20 at the fifth standard terminal position and is connected to a third line conductor 16. A ground terminal 32 is also provided in the socket housing 20. In a single phase three wire or three wire network socket wiring configuration, the ground terminal 32 is connected to the potential jaw terminal 30.

The jaw terminals 22, 24, 26 and 28 respectively receive corresponding line and load blade terminals of the watthour meter 17 when the watthour meter 17 is mounted in the socket 18. The third potential terminal of the watthour meter 17 is mounted at the fifth terminal position for removable insertion into the jaw terminal 30 in the socket 18.

The center or third line conductor 16 is typically connected to a electric connector 34 mounted in a standoff 36 on the back wall of the socket housing 20. A similar connector 38 receives the third load conductor 40 extending from the socket 18 to the load distribution network in the residence or commercial site. Additional load conductors 42 and 44 extend from the load jaw terminals 26 and 28, respectively, to the load distribution network.

A typical watthour meter 17, shown in FIG. 1, mounted in the socket 18 includes current elements for measuring the power drawn between the pairs of line jaw terminals 22 and 24 and the load jaw terminals 26 and 28. The center or third line conductor 16 and the third load conductor 40 pass current directly through the socket 18 via the connectors 34 and 38 with only voltage potential being measured in the watthour meter 17 since it is assumed that all current drawn through the other two conductors of the service returns through the center conductor similar to a single phase three wire service where the neutral current is not measured.

Figure 3:
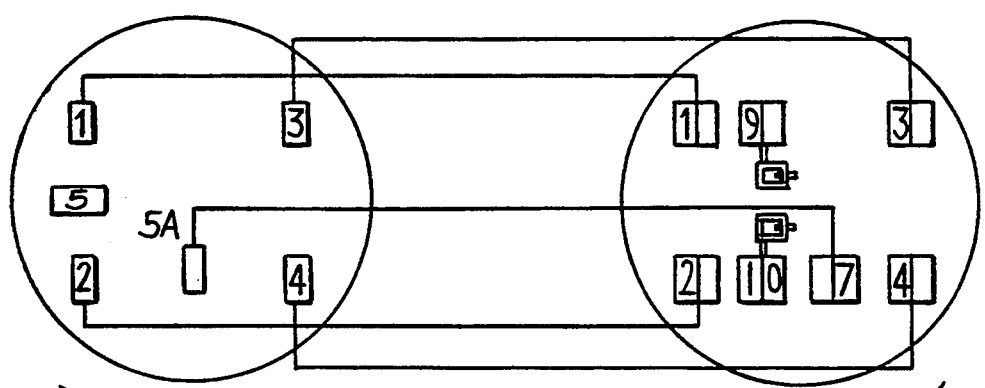
FIG. 3 is a schematic diagram showing the interconnections between the jaw and blade terminals on the shell and base, respectively, of a prior art watthour meter socket adapter designed to measure power through the third conductor of the three phase three wire watthour meter shown in FIG. 1.
Figure 4:
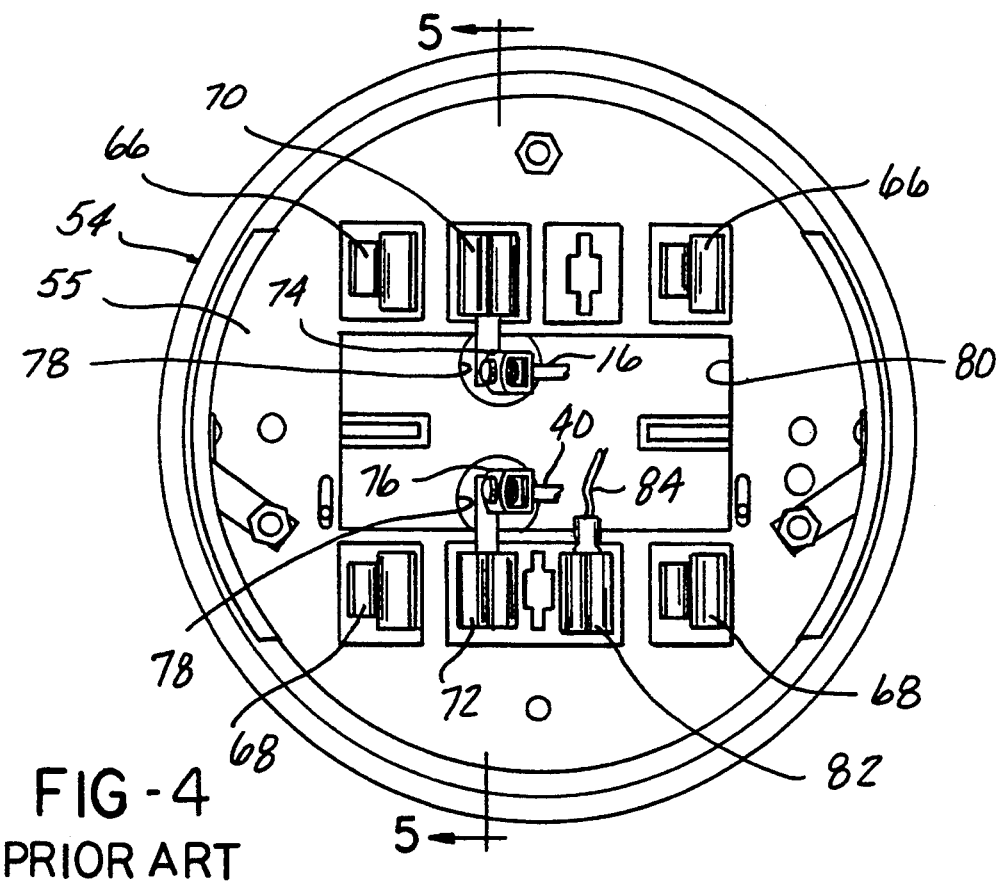
FIG. 4 is a front elevational view of the shell of the prior art socket adapter shown in FIG. 3.
Figure 5:
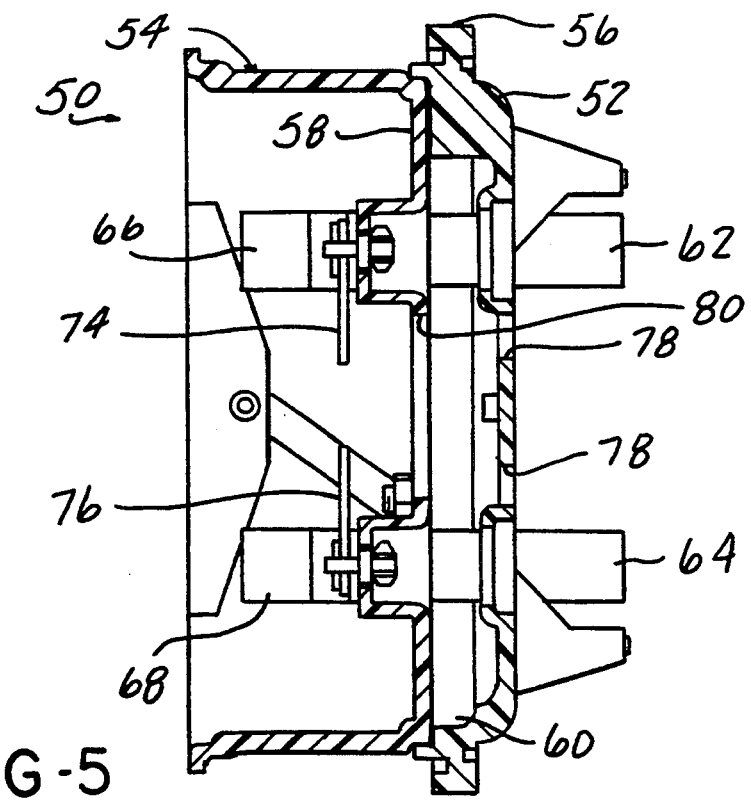
FIG. 5 is a cross sectional view, generally taken along line 5—5 in FIG. 4.

In order to prevent any unauthorized diversion of unmetered power through the third load conductor 40 which may be obtained by merely connecting a load between the third load conductor 40 and ground, the assignee of the present invention previously devised a watthour meter socket adapter 50 shown in FIGS. 3, 4 and 5. As is conventional, the socket adapter 50 includes a base 52 which is connected to an annular, hollow shell 54 which has an open outer end and a solid bottom wall 58. The base 52 conventionally has a raised peripheral edge 56 which engages the bottom wall 58 on the shell 54 to form an interior cavity 60 between the bottom wall 58 and the base 52. Apertures are formed in the base 52 for receiving a plurality of line and load blade terminals 62 and 64, only one of each pair of line and load blade terminals being shown in FIG. 5. The line and load blade terminals 62 and 64 are respectively insertable into the pairs of line and load jaw terminals 22, 24, 26 and 28 in the socket 18 shown in FIG. 2.

A jaw terminal portion is formed on the opposite end of each pairs of blade terminals 62 and 64 for receiving a blade terminal of a watthour meter therein in a conventional watthour meter mounting arrangement. Thus, a pair of line jaw terminals 66 are integrally formed with and connected to the pair of line blade terminals 62. Likewise, a pair of load jaw terminals 68 are connected to and integrally formed with the pair of load blade terminals 64.

Folded over jaw terminals 70 and 72 were mounted at the ninth and tenth standard terminal positions in the shell 54 and are attached to the bottom wall 58 of the shell 54 by suitable fasteners. An electrical connector lug 74 or 76 is connected to and extends outward from each folded over jaw terminal 70 and 72, respectively. The connector lugs 74 and 76 respectively received the third line conductor 16 and the third load conductor 40 from the socket housing 20 after the third line and load conductors 16 and 40 were disconnected from the center standoff connectors 34 and 38 shown in FIG. 2 and passed through apertures 78 in the base 52 and through a large aperture 80 formed in the bottom wall 58 of the shell 54 of the socket adapter 50.

A folded over ground jaw terminal 82 is also mounted in the bottom wall 58 of the shell 54 at the seventh standard terminal position and connected by means of a separate jumper 84 to a ground blade terminal mounted in the base 52 of the socket adapter 50. The jumper 84 is required since the ground jaw terminal 82 in the shell 54 which receives the ground terminal of a watthour meter is not aligned with the ground blade terminal typically at the fifth standard terminal position in the base 52 of the socket adapter 50. The jumper 84 passes through the aperture 80 in the shell 54 to a pigtail connection to the ground blade terminal in the base 52.

While this socket adapter configuration and wiring arrangement provided a means for measuring electric current drawn through the third line conductor 16 and the third load conductor 40, extensive modifications to a standard socket adapter are required. In addition, a wire splice was required to extend each of the third line conductor 16 and the third load conductor 40 to the lugs 74 and 76 in the shell 54 of the socket adapter 50.

Figure 6:
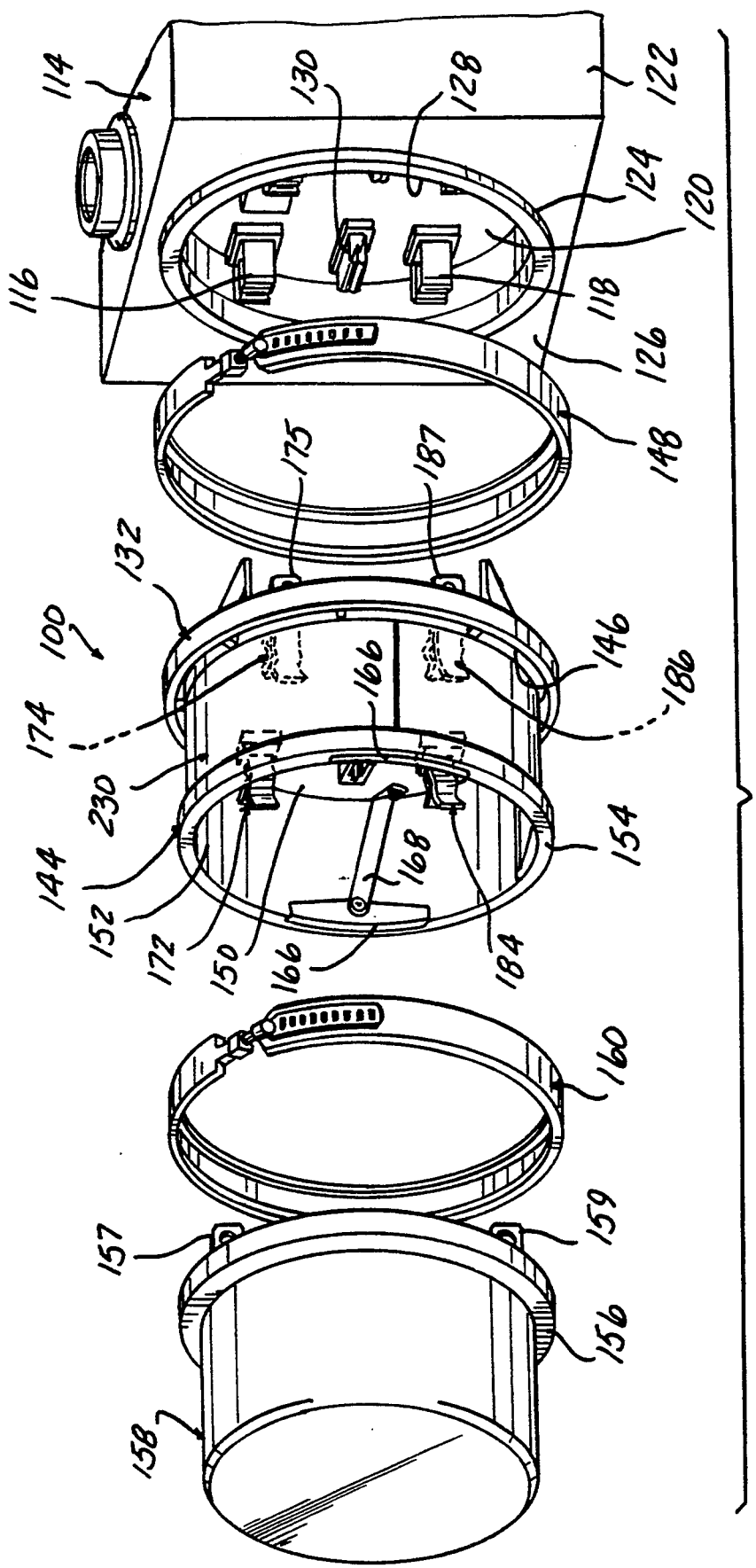
FIG. 6 is an exploded perspective view of a watthour meter socket adapter of the present invention mountable between a watthour meter socket and a watthour meter.

In an attempt to simplify the construction of a watthour meter socket adapter for measuring electric power on all three phases of a three phase, three wire electric power service, a socket adapter 100 according to the present invention and shown in FIGS. 6–11 was devised. As shown in FIG. 6, the watthour meter socket adapter 100 is devised to receive a conventional two current element electric watthour meter 158 in a snap-in connection via mating jaw and blade terminals. The watthour meter socket adapter 100 is releasibly mounted in a conventional watthour meter socket denoted generally by reference number 114 through mating connection between jaw and blade terminals in the socket 114 and the watthour meter socket adapter 100, as described hereafter.

As is conventional, a pair of line jaw terminals 116, only one of which is depicted in FIG. 6, are mounted on the back wall 120 of the socket 114. A corresponding pair of load jaw terminals 118 are also mounted on the back wall 120 of the socket 114.

The socket 114 includes a conventional housing 122 which is illustrated in FIG. 6 as being in the form of a ring-style socket in which a raised mounting flange 124 is formed on the front cover 126 of the housing 122 and spaced a short distance from the exterior surface of the cover 126. The mounting flange 124 surrounds an aperture 128 through which the watthour meter socket adapter 100 is removably mounted, as described hereafter.

In addition to the line and load jaw terminals 116 and 118, a ground jaw terminal 130 is also mounted on the back wall 120 of the socket housing 122 and is connected to a ground in the socket housing 122.

Figure 7:
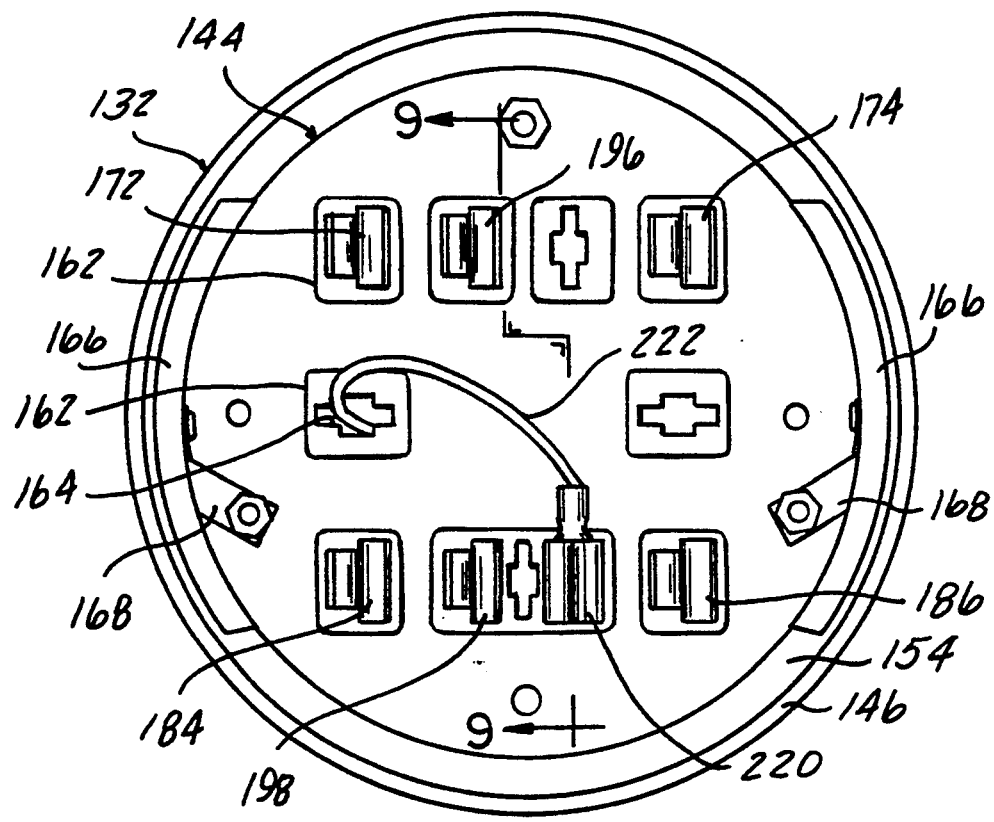
FIG. 7 is a front elevational view of the watthour meter socket adapter shown in FIG. 6.
Figure 8:
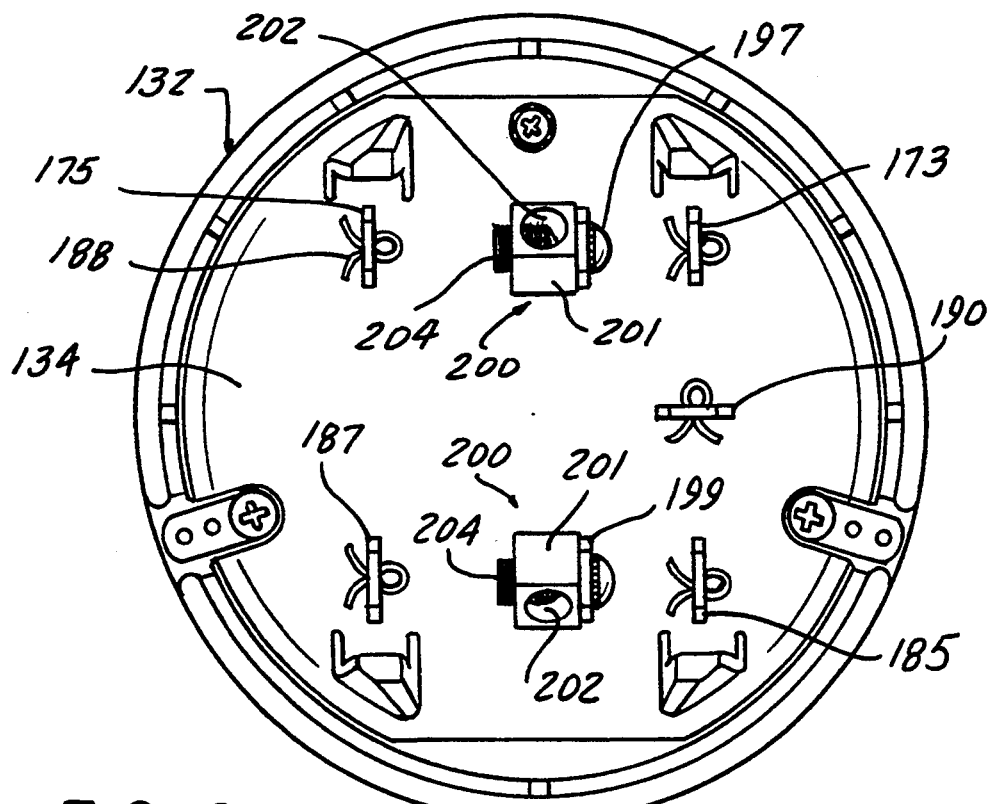
FIG. 8 is a rear elevational view of the watthour meter socket adapter shown in FIGS. 6 and 7.
Figure 9:
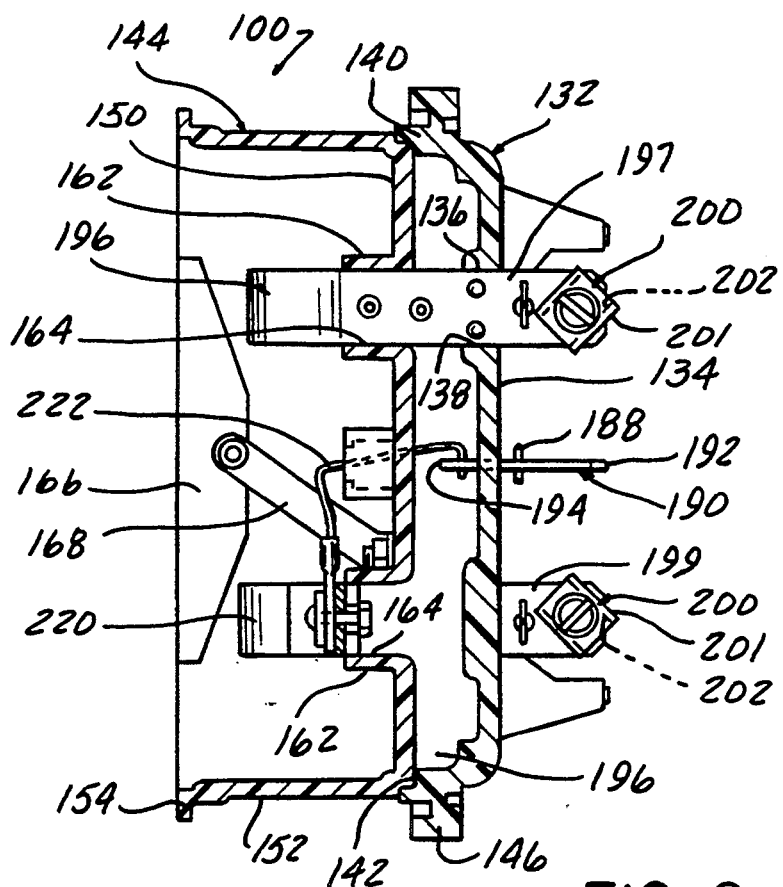
FIG. 9 is a cross sectional view generally taken along line 9—9 in FIG. 7.

As shown in FIG. 6, and in greater detail in FIGS. 7, 8 and 9, the watthour meter socket adapter 100 conventionally includes a base 132 having a central wall 134 of generally circular shape. A plurality of generally rectangular projections 136 are formed in the central wall 134. A slot 138 is formed through each projection 136. The base 132 also includes an annular peripheral flange 140 which has an integral shoulder 142 formed thereon which receives a peripheral edge of a shell 144. An enlarged rim 146 extends radially outward from the peripheral flange 140 and engages the mounting flange 124 on the socket housing 122. A conventional sealing ring 148 is lockingly disposed about the mating rim and mounting flange 146 and 124 to lockingly attach the socket adapter 100 to the socket 114.

The shell 144 is formed with a generally circular bottom wall 150 and an annular side wall 152 extending therefrom. The annular side wall 152 terminates in an enlarged peripheral mounting flange 154 which engages a corresponding flange 156 on a conventional watthour meter 158, as shown in FIG. 6. A conventional sealing ring 160 is lockingly disposed about the mating mounting flanges 154 and 156 to lockingly attach the watthour meter 158 to the socket adapter 100.

A plurality of raised bosses 162 are formed in and extend outward from the bottom wall 150 of the shell 144. Apertures 164 are formed in each boss 162 to receive jaw terminals, as described hereafter. A pair of conventional ground surge strips 166 are mounted on the flange 154 and are connected by suitable electrically conductive strips 168 to ground. Suitable fasteners extend through the bottom wall 150 of the shell 144 to the base 132 to connect the shell 144 to the base 132.

A plurality of contacts or terminals are mounted in the socket adapter 100 for respectively receiving the line and load blade terminals 157 and 159, respectively, of the watthour meter 158 therein and for connecting the socket adapter 100 to the jaw terminals 116, 118 and 130 in the socket 114. As shown in FIGS. 6, 7 and 9, a first pair of line jaw terminals 172 and 174 are mounted in the slots 164 formed in the bosses 162 located at the first and third standard terminal mounting positions in the shell 144. Each jaw terminal 172 and 174 is conventionally formed of an elongated, electrically conductive strip 176, shown in FIG. 10 which is joined, such as by rivets, to a corresponding, shorter conductive strip 178. One end 180 of the strip 176 and the corresponding end 182 of the shorter strip 178 are bent outward with respect to each other to form an opening or jaw therebetween for removable insertion of a blade terminal 157 or 159 on the watthour meter 158 therein. Similarly constructed load jaw terminals 184 and 186 are also mounted in the shell 144 at the second and fourth standard terminal mounting positions as shown in FIG. 7.

The other end of each conductive strip 176 of each jaw terminal 172, 174, 184 and 186 is in the form of a planar blade terminal which is formed as an integral part of the conductive strip 176. Thus, jaw terminal 172 located at the first standard terminal mounting position in the shell 144 has a blade terminal 173 extending therefrom through an aligned aperture 136 in the base 132, with the blade terminal 173 extending outward from the base 132. Similarly, as shown in FIG. 8, jaw terminal 174 has a blade terminal 175 extending therefrom, jaw terminal 184 has a blade terminal 185 extending therefrom and jaw terminal 186 has a blade terminal 187 extending therefrom. Cotter pins are mounted through apertures in each blade terminal 173, 175, 185 and 187 to stationarily position each blade terminal with respect to the central wall 134 of the base 132, as shown in FIG. 8.

A ground blade terminal 190 is mounted in the base 132 at the standard fifth terminal mounting position. As shown in FIG. 9, the ground blade terminal 190 has a short length with a first end 192 extending outward from the base 132 for releasible insertion into the ground jaw terminal 130 in the socket 114 and an opposed second end 194 which is disposed in a hollow interior cavity 196 formed between the central wall 134 of the base 132 and the bottom wall 150 of the shell 144.

Also included in the socket adapter 100 are an additional pair of jaw terminals 196 and 198 which are respectively located at the ninth and tenth standard terminal mounting positions in the shell 144 as shown in FIG. 7. Each jaw terminal 196 and 198 has an integral blade terminal 197 and 199, respectively, extending therefrom outward through the base 132 as shown in FIG. 8. The jaw terminals 196 and 198 are positioned to releasibly receive corresponding blade terminals on the watthour meter 158 which are internally connected within the watthour meter 158 to a separate current element for measuring current drawn through conductors attached to the jaw terminals 196 and 198, as described hereafter.

Figure 10:
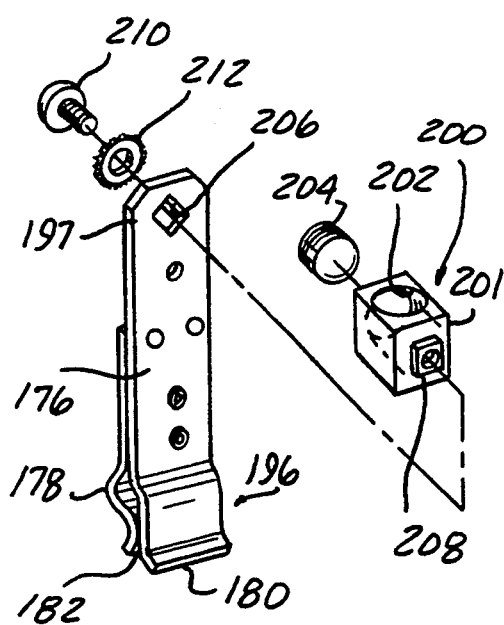
FIG. 10 is an exploded perspective view showing a connector lug mounted on one of the blade terminals of the watthour socket adapter shown in FIG. 8.

Electrical conductor connector means denoted generally by reference number 200 in FIG. 8 is mounted on each blade terminal 197 and 199 externally of the socket adapter 132 for receiving the third line conductor 16 and the third load conductor 40 in the socket 114, which conductors 16 and 40 are shown in FIG. 2. In a simple form dependent on the size of the electrical conductor to be attached to the blade terminals 197 or 198, the connector means could be a screw which threadingly engages an aperture in the blade terminals 197 or 198 to attach a conductor to the blade terminal 197 or 198. In the described socket application, the connector means 200, as shown in FIGS. 8, 9 and 10, preferably comprises a lug 201 having a generally cubical shape and formed of an electrically conductive material. A conductor receiving bore 202 is formed in the lug 201 and is sized to receive the third line or third load conductor 16 or 40 therein. A transverse bore, not shown, extends through each lug 201 and threadingly receives a fastener 204 which extends through the bore into engagement with one end of the conductor 16 or the conductor 40 inserted into the bore 202 to fixedly attach the end of the conductor 16 or 40 to the lug 201. The fastener 204 is preferably a hex drive set screw to facilitate assembly in the restricted space between the blade terminals 197 and 199.

Mounting means are provided for fixedly and non-rotatingly mounting one lug 201 to either the blade terminal 197 or the blade terminal 199. In an exemplary embodiment shown in detail in FIG. 10, the mounting means comprises a polygonal shaped aperture 206 formed in each of blade terminal 197 and blade terminal 199. The polygonal shaped aperture 206 may have a square shape as shown in FIG. 10. A complimentary shaped boss or projection 208 is formed on one side surface of the lug 201 and is mountable in the aperture 206 to mount the lug 201 in a desired angular position with respect to the longitudinal axis of each blade terminal 197 and 199, as shown in FIGS. 8 and 9. A fastener means, such as a screw 210, is insertable through a lock washer 212 and the aperture 206 in the blade terminal 197 or 199 into the boss 208 on the lug 201 to fixedly attach the lug 201 to the blade terminal 197 or 199.

In the angular orientation of the lug 201 on each blade terminal 197 and 199, the conductor receiving bore 200 in each lug 201 extends angularly outward from the central wall 134 of the base 132 of the socket adapter 100 for easily receiving one of the line conductor 16 or the load conductor 40 therein, as described hereafter.

As shown in FIG. 7, a ground jaw terminal 220 is mounted in the shell 144 at the standard seventh terminal mounting position. The ground jaw terminal 220 is preferably a folded over jaw terminal which is mounted on one of the bosses 162 on the bottom wall 150 of the shell 144. The ground jaw terminal 220 is positioned to receive the ground blade terminal of the watthour meter 158.

According to the present invention, a jumper means 222 in the form of an electrical conductor or wire is connected by a suitable wire connector to the ground jaw terminal 220 as shown in FIGS. 7 and 9. The jumper 222 extends from the jaw terminal 220 through an aperture 164 formed in one of the bosses 162 on the bottom wall 150 of the shell 144 to an electrical connection with the second end 194 of the blade terminal 190 located at the standard fifth terminal position on the base 132. This provides a ground connection between the watthour meter 158 and socket ground in the socket 114.

In addition to the above features, the watthour meter socket adapter 100 of the present invention may also include an annular anti-tampering ring 230 formed of a hardened metallic material which is mounted about the exterior of the annular side wall 152 of the shell 144, as shown in FIG. 6. Further details concerning the construction and use of the hardened anti-tampering ring 230 may be had by referring to co-pending U.S. patent application Ser. No. 08/130,265, filed Oct. 1, 1993, assigned to the assignee of the present invention, the details of which are incorporated herein by reference in their entirety.

The socket adapter 100 of the present invention may be uniquely used to measure electrical power on the third leg of electrical power service to a electric load distribution network. First, the socket adapter 100 is constructed as described above with pairs of line and load jaw and blade terminals arranged at the standard first, second, third and fourth terminal mounting positions. An additional pair of terminals 196 and 198 including jaw and blade terminal portions are mounted at the standard ninth and tenth terminal mounting positions in the socket adapter 100. The connectors or lugs 201 are mounted on the blade terminal portions 197 and 199 of the terminals 196 and 198. The ground jaw terminal 220 is mounted at the standard seventh terminal mounting position in the shell 144 and connected by jumper 222 to the blade terminal 190 mounted at the fifth standard terminal mounting position in the base 132.

Figure 11:
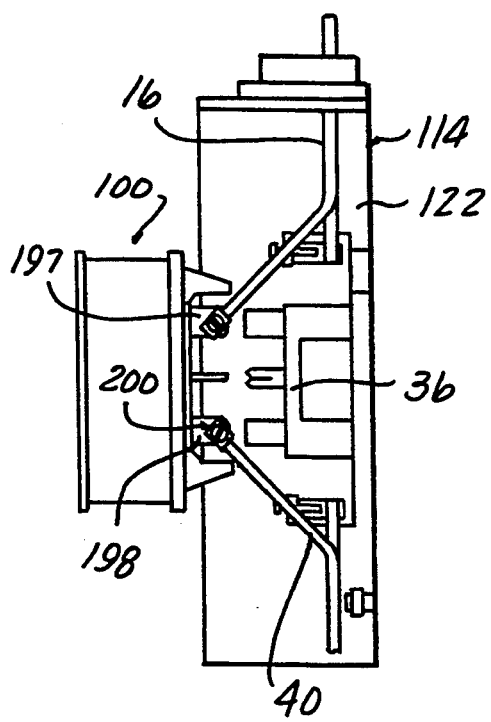
FIG. 11 is a side elevational view, with a portion of the watthour meter socket removed, to show the mounting of the socket adapter in a watthour meter socket and the connection of the third line and load conductors to the lugs.

Next, the third line conductor 16 and the third load conductor 40, shown in FIG. 11, are disconnected from the respective electrical connectors 34 and 38 mounted on the standoff 36 in the socket 114. With the socket adapter 100 located in close proximity with the front cover 126 of the socket 114, the ends of the third line conductor 16 and the third load conductor 40 are inserted into the conductor receiving bores 202 in the lugs 201 mounted on the blade terminals 197 and 199 and fixedly secured in place by means of the fasteners 204. The socket adapter 100 is then fully inserted into the socket 114 with all blade terminals securely mating in the respective jaw terminals in the socket 114. The sealing ring 148 is then mounted about the rim or mounting flange 146 on the socket adapter 100 and the mounting flange 124 on the cover 126 of the socket 114 to lockingly mount the socket adapter 100 in the socket 114. The watthour meter 158 is then inserted into mating engagement with the jaw terminals in the socket adapter 100 and the sealing ring 160 mounted over the mating mounting flanges 156 on the watthour meter 158 and the mounting flange 154 on the shell 144 of the socket adapter 100.

In summary, there has been disclosed a unique watthour meter socket adapter which has special connectors to allow a watthour meter, which has more plug-in blade terminals than the original socket was designed to receive, to be used with the original socket. The watthour meter socket adapter is of conventional construction and does not require extensive modification to the socket adapter itself to enable a ground jumper or additional jaw and blade terminals to be added to the socket adapter.

What is claimed is:

1. A watthour meter socket adapter for interconnecting a watthour meter socket having a plurality of jaw terminals to a watthour meter having a plurality of outwardly extending blade terminals present in a greater number than the number of jaw terminals in the watthour meter socket, the watthour meter socket adapter comprising:
   a housing;
   a plurality of electrical terminals mounted in the housing, each electrical terminal having a jaw terminal at one end for receiving one of the blade terminals of a watthour meter and a blade terminal at another end extending through and outward from the housing for interconnection into a jaw terminal in a watthour meter socket;
   at least one additional jaw terminal mounted in the housing separate from the jaw terminals connectible to the blade terminals of a watthour meter;
   at least one additional blade terminal extending through and outward from the housing separate from the blade terminals connected to the jaw terminals in the housing; and
   connector means, mounted on the at least one additional blade terminal externally of the housing, for receiving an electrical conductor in a watthour meter socket in an electrical connection.

2. The watthour meter socket adapter of claim 1 further comprising:
   jumper means, disposed within the housing of the watthour meter socket adapter, for connecting the at least one additional jaw terminal to the at least one additional blade terminal.

3. The watthour meter socket adapter of claim 1 wherein the connector means comprises:
   a lug having a conductor receiving bore formed therein;
   a fastener receiving bore formed in the lug transverse to the conductor receiving bore for receiving a fastener to fixedly and releasibly attach a conductor to the lug; and
   means for attaching the lug to the at least one additional blade terminal of the watthour meter socket adapter.

4. The watthour meter socket adapter of claim 3 wherein the lug attaching means comprises:
   a polygonal shaped aperture formed in the at least one additional blade terminal;
   a raised, polygonal-shaped boss formed on an exterior surface of the lug for matingly engaging the polygonal shaped aperture in the at least one additional blade terminal, an aperture formed through the boss; and
   a fastener extendible through the aperture in the at least one additional blade terminal and the aperture in the boss on the lug to fixedly attach the lug to the at least one additional blade terminal.

5. The watthour meter socket adapter of claim 4 wherein:
   the conductor receiving bore in the lug is angularly offset from a longitudinal axis along the extent of the at least one additional blade terminal to which the lug is attached.

6. The watthour meter socket adapter of claim 2 wherein the socket adapter further comprises:
   a base;
   a shell connected to the base, the shell having an annular side wall extending between an open end and a bottom;
   the base having a raised peripheral rim engageable with the shell and forming a cavity between the bottom of the shell and the base;
   a plurality of pairs of aligned apertures formed in the base and the bottom of the shell for fixedly receiving one of the plurality of electrical terminals therein,
   the at least one additional jaw terminal releasibly receiving a blade terminal of the watthour meter therein being mounted in the shell;
   the at least one additional blade terminal insertable into a jaw terminal in a watthour meter socket being mounted in the base and having one end disposed in the cavity between the base and the bottom of the shell, the at least one additional blade terminal in the base being positionally offset from the at least one additional jaw terminal in the shell;

an aperture formed in the bottom of the shell;

jumper means extending from the at least one additional jaw terminal in the shell to the at least one additional blade terminal in the base through the aperture in the bottom of the shell.

7. The watthour meter socket adapter of claim 1 further comprising:

the at least one additional jaw terminal including a pair of terminals each having a jaw portion at one end for receiving a blade terminal of a watthour meter connected to a separate current element in a watthour meter;

the at least one additional blade terminal including two additional blade terminals mounted in the watthour meter socket adapter; and the connector means being mounted on at least two additional blade terminals.

8. The watthour meter socket adapter of claim 1 wherein:

the plurality of electrical terminals in the watthour meter socket adapter housing connected to line and load jaw terminals in a watthour meter socket and extending through the housing to receive blade terminals of a watthour meter are located at the first, second, third and fourth standard terminal positions;

a blade terminal in the watthour meter socket adapter housing connected to a jaw terminal in a watthour meter socket connected to ground is located at the standard fifth terminal position;

a jaw terminal in the watthour meter socket adapter housing receiving a ground blade terminal of a watthour meter is located at the standard seventh terminal position in the housing;

the pair of additional blade terminals in the watthour meter socket adapter housing being connected to a third line conductor and a third load conductor in the watthour meter socket by the electrical connector means and located at the ninth and tenth standard terminal positions; and a jumper extending from the jaw terminal at the standard seventh terminal mounting position to the blade terminal at the standard fifth terminal mounting position.

9. In an electric power service including a watthour meter socket having two jaw terminals receiving two electrical power line conductors of a three phase, three conductor service, two jaw terminals receiving two electrical load conductors connected to an external electrical load distribution network, an electrical connector normally receiving and electrically connecting a third line conductor to a third load conductor, and a jaw terminal connected to third line conductor, a watthour meter having blade terminals normally releasibly mounted in the jaw terminals in the watthour meter socket for interconnection through the jaw terminals to the two line and two load conductors, the watthour meter having an additional pair of blade terminals connected internally within the watthour meter to a third current element for measuring electrical power on the third line and the third load conductors, and a ground blade terminal positioned for receiving a ground blade terminal of the watthour meter, the ground blade terminal being positionally offset from a ground jaw terminal in the watthour meter socket, the improvement comprising:

a watthour meter socket adapter including:

a housing;

a plurality of electrical terminals mounted in the housing, each having a jaw terminal formed at one end for receiving one of the blade terminals of the watthour meter therein and a blade terminal portion at another end for insertion into one of the jaw terminals in the watthour meter socket connected to the two of the three line and load conductors;

a ground blade terminal mounted in the housing insertable into a jaw terminal in the watthour meter socket connected to ground;

a jaw terminal mounted in the housing for receiving a ground blade terminal of the watthour meter;

a pair of additional electrical terminals mounted in the housing and having a blade terminal portion at one end releasibly insertable into a pair of jaw terminals in the watthour meter socket and a jaw terminal portion at another end releasibly receiving a pair of blade terminals of the watthour meter connected to a third current element in the watthour meter;

connector means, mounted on the blade terminal portion of the additional electrical terminals, for electrically receiving the third line conductor and the third load conductor in the watthour meter socket after the third line conductor and the third load conductor have been disconnected from each other in the watthour meter socket; and jumper means for connecting the jaw terminal in the housing receiving the ground blade terminal of the watthour meter to the ground blade terminal in the housing insertable into the jaw terminal in the watthour meter socket connected to ground.

10. The improvement of claim 9 wherein:

the plurality of electrical terminals in the housing connected to the line and load jaw terminals in the watthour meter socket are located at the standard first, second, third and fourth terminal positions;

the ground blade terminal in the housing connected to the jaw terminal in the watthour meter socket is connected to ground located at the standard fifth terminal position;

the jaw terminal in the housing receiving the ground blade terminal of the watthour meter is located at the standard seventh terminal position in the housing;

the pair of blade terminals in the housing connected to the third line conductor and the third load conductor by the electrical connector means are located at the standard ninth and tenth terminal positions; and the jumper means extends from the jaw terminal at the standard seventh terminal mounting position to the blade terminal at the standard fifth terminal mounting position.

11. The improvement of claim 9 wherein the connector means comprises:

a lug having a conductor receiving bore formed therein;

a fastener receiving bore formed in the lug transverse to the conductor receiving bore for receiving a fastener to fixedly and releasibly attach a conductor to the lug; and means for attaching the lug to one of the pair of blade terminals in the watthour meter socket adapter.

12. The improvement of claim 11 wherein the lug attaching means comprises:
 a polygonal shaped aperture formed in at least one of the pair of blade terminals;
 a raised, polygonal-shaped boss formed on an exterior surface of the lug for matingly engaging the polygonal shaped aperture in the at least one blade terminal, an aperture formed through the boss; and
 a fastener extendible through the aperture in the at least one blade terminal and the aperture in the boss on the lug to fixedly attach the lug to the at least one blade terminal.

13. The improvement of claim 11 wherein:
 the conductor receiving bore in the lug is angularly offset from a longitudinal axis along the extent of the at least one of blade terminals to which the lug is attached.

14. The improvement of claim 11 wherein the socket adapter further comprises::
 a base;
 a shell connected to the base, the shell having an annular side wall extending between an open end and a bottom;
 the base having a raised peripheral rim engageable with the shell and forming a cavity between the bottom of the shell and the base;
 a plurality of pairs of aligned apertures formed in the base and the bottom of the shell for fixedly receiving one of the plurality of electrical terminals therein;
 the jaw terminal releasibly receiving the ground blade terminal of the watthour meter therein being mounted in the shell;
 the ground blade terminal insertable into the jaw terminal in the watthour meter socket connected to ground being mounted in the base and having one end disposed in the cavity between the base and the bottom of the shell, the ground blade terminal in the base being positionally offset from the ground jaw terminal in the shell;
 an aperture formed in the bottom of the shell; and
 the jumper means extending from the ground jaw terminal in the shell to the ground blade terminal in the base through the aperture in the shell.

15. In combination, a watthour meter socket, a watthour meter having blade terminals and a ground blade terminal, and a watthour meter socket adapter comprising:
 the watthour meter socket including:
  a plurality of electrical jaw terminals mounted therein for receiving two of three line conductors from a three phase three wire conductor electric power service and for receiving two of three load conductors connected to an electric load distribution network; and
  an electrical connector for connecting the third line conductor to a third load conductor;
 the watthour meter having a plurality of blade terminals extending outward therefrom for normal insertion into the jaw terminals of the watthour meter socket;
  one jaw terminal in the watthour meter socket being connected to ground;
 the watthour meter socket adapter including:
  a housing;
  a plurality of electrical terminals mounted in the housing and having a jaw terminal formed at one end for receiving a blade terminal of the watthour meter therein and a blade terminal portion at another end for insertion into a jaw terminal in the watthour meter socket connected to two of three line and load conductors in the watthour meter socket;
  a ground blade terminal mounted in the housing insertable into a ground jaw terminal in the watthour meter socket connected to ground;
  a jaw terminal mounted in the housing for receiving the ground blade terminal of the watthour meter;
  a pair of electrical terminals mounted in the housing, each having a jaw terminal portion at one end for releasibly receiving a blade terminal of the watthour meter connected to a separate current element in the watthour meter and blade terminals at another end extending through the housing;
  connector means, mounted on the blade terminal portions of the pair of electrical terminals extending through and outward from the housing, for electrically receiving the third line conductor and the third load conductor in the watthour meter socket after the third line conductor and the third load conductor have been disconnected from each other; and
  jumper means for connecting the jaw terminal in the housing receiving the ground blade terminal of the watthour meter to the blade terminal in the housing insertable into the jaw terminal in the watthour meter socket connected to ground.

16. A method for converting three phase three conductor electrical power service to three phase four wire conductor service to an electrical load distribution network comprising the steps of:
 providing a watthour meter socket with a plurality of line and load jaw terminals individually connected to two of three line conductors and two of three load conductors;
 providing an electrical connector in the watthour socket for normally connecting a third line conductor to a third load conductor;
 providing a watthour meter with at least two current elements for measuring electrical power through the line and load jaw terminals in the watthour meter socket, the watthour meter having a plurality of blade terminals connected to the line and load jaw terminals in the watthour meter socket, a pair of blade terminals connected to one current element for measuring electrical power on a third line and a third load conductor and a ground blade terminal connectible to ground in the watthour meter socket;
 providing a watthour meter socket adapter with blade terminals insertable into the line and load jaw terminals in the watthour meter socket;
 providing a jaw terminal in the watthour meter socket adapter for receiving the ground blade terminal of a watthour meter and a blade terminal connected to the jaw terminal for insertion into a ground jaw terminal in the watthour meter socket;
 mounting electrical connectors on two of a plurality of additional blade terminals mounted in the watthour meter socket adapter;

disconnecting the third line conductor and the third load conductor from the connector in the socket;

connecting the ground blade terminal in the watthour meter socket to the third line jaw terminal in the watthour meter socket;

connecting the third line conductor and the third load conductor in the watthour meter socket to the electrical connectors on the two blade terminals on the watthour meter socket adapter;

connecting a jumper from the ground jaw terminal in the watthour meter socket adapter to the ground blade in the watthour meter socket adapter insertable into the ground jaw terminal in the watthour meter socket;

inserting the watthour meter socket adapter into the watthour meter socket; and inserting a watthour meter into the watthour meter socket adapter to measure electrical power on all three phases of a four wire electrical power service to a electrical load distribution network.

* * * * *